(12) United States Patent
Ahn

(10) Patent No.: US 8,686,760 B2
(45) Date of Patent: Apr. 1, 2014

(54) BUFFER AND DRIVING METHOD OF THE SAME

(75) Inventor: Jung-Keun Ahn, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 201 days.

(21) Appl. No.: 13/018,237

(22) Filed: Jan. 31, 2011

(65) Prior Publication Data

US 2011/0279151 A1    Nov. 17, 2011

(30) Foreign Application Priority Data

May 14, 2010    (KR) .................. 10-2010-0045576

(51) Int. Cl.
*H03K 3/00*    (2006.01)

(52) U.S. Cl.
USPC .......................................................... 327/108

(58) Field of Classification Search
None
See application file for complete search history.

(56) References Cited

U.S. PATENT DOCUMENTS

| | | | | |
|---|---|---|---|---|
| 8,008,950 B2 * | 8/2011 | Jinta | ............................. | 327/108 |
| 2010/0253393 A1 * | 10/2010 | Yamamoto et al. | ........... | 327/108 |
| 2010/0289535 A1 * | 11/2010 | Chen et al. | .................... | 327/109 |

FOREIGN PATENT DOCUMENTS

| | | |
|---|---|---|
| KR | 2003-0014161 | 2/2003 |
| KR | 10-2004-0012133 A | 2/2004 |
| KR | 10-2004-0057407 A | 7/2004 |
| KR | 10-2004-0076087 | 8/2004 |
| KR | 10-2007-0080969 A | 8/2007 |

OTHER PUBLICATIONS

Jung et al., A New Low-Power pMOS Poly-Si Inverter for AMDs, IEEE Electron Device Letters, vol. 26, No. 1, Jan. 2005, pp. 23-25.

* cited by examiner

*Primary Examiner* — Lincoln Donovan
*Assistant Examiner* — Khareem E Almo
(74) *Attorney, Agent, or Firm* — Christie, Parker & Hale, LLP

(57) ABSTRACT

A buffer and a driving method thereof are provided. The buffer includes a first transistor for transmitting a first power source voltage to an output terminal according to an input voltage, a second transistor for transmitting an inverted voltage of the input voltage to the output terminal, a capacitor including a first terminal coupled to a gate of the second transistor and a second terminal configured to be input with a first level voltage or a second level voltage according to the input voltage, and a third transistor for transmitting a second power source voltage to the gate of the second transistor according to the input voltage.

27 Claims, 3 Drawing Sheets

BUFFER AND DRIVING METHOD OF THE SAME

CROSS-REFERENCE TO RELATED APPLICATION

This application claims priority to and the benefit of Korean Patent Application No. 10-2010-0045576 filed in the Korean Intellectual Property Office on May 14, 2010, the entire contents of which are incorporated herein by reference.

BACKGROUND

1. Field

The present invention relates to a buffer and a driving method thereof.

2. Description of Related Art

Currently, various flat panel displays that have reduced weight and volume, which are drawbacks of cathode ray tubes, are being developed. Flat panel displays include liquid crystal displays (LCDs), field emission displays (FEDs), plasma display panels (PDPs), and organic light emitting diode (OLED) displays.

Research to integrate a display panel and a driving circuit panel in active matrix liquid crystal displays (LCDs) or organic electro-luminescence displays has been actively undertaken.

A technique for integrating the driving circuit that has been researched generally uses a circuit of CMOS thin film transistors. Accordingly, a plurality of masks are required when forming N-type and P-type transistors together, and additional processes are required to respectively control the threshold voltage. This decreases process yield and increases process cost, and operational reliability of the circuit is decreased, thereby causing a reproducibility problem.

Generally, N-type thin film transistors are thermally damaged by a hot carrier during element driving, as compared with P-type thin film transistors, such that potentially severe characteristic degradation is generated.

The above information disclosed in this Background section is only for enhancement of understanding of the background of the invention and therefore it may contain information that does not form the prior art that is already known in this country to a person of ordinary skill in the art.

SUMMARY

Embodiments of the present invention provide a buffer circuit that improves performance for realizing an output signal of a low level in a circuit design of a buffer by using P-type thin film transistors.

Also, embodiments of the present invention provide a buffer capable of being driven with low power by being stably driven for a process variation of the transistor and maintaining a small size of the transistor.

Also, embodiments of the present invention provide an efficiency driving method of a buffer by using a buffer designed with P-type thin film transistors.

The technical features of the present invention are not limited to the above-mentioned features, and other technical features that have not been mentioned will become evident to those skilled in the art from the following description.

A buffer according to an exemplary embodiment of the present invention includes a first transistor for transmitting a first power source voltage to an output terminal according to an input voltage, a second transistor for transmitting an inverted voltage of the input voltage to the output terminal, a capacitor including a first terminal coupled to a gate of the second transistor and a second terminal configured to be input with a first level voltage or a second level voltage according to the input voltage, and a third transistor for transmitting a second power source voltage to the gate of the second transistor according to the input voltage.

The first transistor may include a gate for receiving the input voltage, a source for receiving the first power source voltage, and a drain coupled to the output terminal.

The second transistor may include a gate coupled to the first terminal of the capacitor, a source for receiving the inverted voltage, and a drain coupled to the output terminal.

The third transistor may include a gate for receiving the input voltage, a source for receiving the second power source voltage, and a drain coupled to the first terminal of the capacitor.

The second power source voltage may be lower than the first power source voltage.

The buffer may further include a fourth transistor for transmitting the first level voltage to the second terminal of the capacitor according to the input voltage.

The first level voltage may be the first power source voltage.

The fourth transistor may include a gate for receiving the input voltage, a source for receiving the first level voltage, and a drain coupled the second terminal of the capacitor.

The buffer may further include a fifth transistor for transmitting the second level voltage to the second terminal of the capacitor according to the inverted voltage.

The second level voltage may be the second power source voltage or the inverted voltage.

The fifth transistor may include a gate for receiving the inverted voltage, a source for receiving the second level voltage, and a drain coupled to the second terminal of the capacitor.

A voltage applied to the first terminal of the capacitor may be maintained within a voltage range for turning on the second transistor.

The voltage range for turning on the second transistor may be according to a voltage of the first terminal of the capacitor reflecting a voltage change of the second terminal of the capacitor by a coupling effect of the terminals of the capacitor.

The voltage range for turning on the second transistor may be between the second power source voltage transmitted when the third transistor is turned on and a voltage of the first terminal of the capacitor reflecting a voltage change of the second terminal of the capacitor by a coupling effect of the terminals of the capacitor when the third transistor is turned off.

The second power source voltage may be a voltage reflecting a threshold voltage of the third transistor; and the voltage of the first terminal of the capacitor reflecting the voltage change of the second terminal of the capacitor may be a voltage reflecting a threshold voltage of a fourth transistor coupled between the second terminal of the capacitor and the second power source voltage.

An output voltage output from the output terminal during a first period in which the first and second transistors are turned on may be according to a resistance ratio of the first and second transistors.

The output voltage output from the output terminal during a second period excluding the first period may be the inverted voltage transmitted through the second transistor.

The transistors of the buffer may be thin film transistors of a same conductive type.

The thin film transistors of the same conductive type may be PMOS transistors.

A driving method of a buffer according to embodiments of the present invention relates to a buffer including a first transistor executing a first switching operation according to an input voltage, a second transistor executing a second switching operation according to the input voltage, a capacitor including a first terminal coupled to a gate of the second transistor, a third transistor including a source or drain electrode coupled to the gate of the second transistor and executing a third switching operation according to the input voltage, and an output terminal coupled to the first and second transistors, the method including, during a period in which the input voltage is a first level voltage: applying a second level voltage according to the input voltage to a second terminal of the capacitor, and turning the first transistor and the second transistor on, and at a time when the input voltage is changed from the first level voltage to a third level voltage: changing a voltage of the second terminal of the capacitor to a fourth level voltage according to the input voltage, changing a voltage of the first terminal of the capacitor to a voltage according to a difference between the second level voltage and the fourth level voltage, and turning the first transistor off and turning the second transistor on.

The turning the first transistor and the second transistor on may include turning on the third transistor to be in an on state by the first level voltage of the input voltage, and transmitting the fourth level voltage to the gate of the second transistor through the third transistor.

The turning the first transistor off and turning the second transistor on may include turning off the third transistor, and floating the first terminal of the capacitor at the time when the input voltage is changed from the first level voltage to the third level voltage.

The method may further include turning the first transistor and the third transistor off and turning the second transistor on during a period in which the input voltage is the third level voltage.

The buffer may further include a fourth transistor transmitting the second level voltage to the second terminal of the capacitor according to the input voltage, and wherein the second level voltage is the first power source voltage.

The buffer may further include a fifth transistor transmitting the fourth level voltage to the second terminal of the capacitor according to an inverted voltage of which the input voltage is inverted, and wherein the fourth level voltage is the second power source voltage or the inverted voltage.

The output voltage output from the output terminal may be according to a resistance ratio of the first transistor and the second transistor in an on state during the period in which the input voltage is the first level voltage.

The output voltage output from the output terminal may be the inverted voltage transmitted through the second transistor during a period excluding the period in which the input voltage is the first level voltage.

A plurality of the transistors of the buffer may be thin film transistors having a same conductive type.

The thin film transistors having the same conductive type may be PMOS transistors.

According to embodiments of the present invention, the transistor is stable for the process variation of the transistor, and the elements are designed to have a small size such that a buffer for reducing the power consumption may be provided.

Also, according to embodiments of the present invention, the circuit structure of the buffer improving the problem for the output signal of the low level as the drawback of the PMOS circuit in the buffer circuit design using the P-type thin film transistor may be provided.

DETAILED DESCRIPTION

Figure 1:
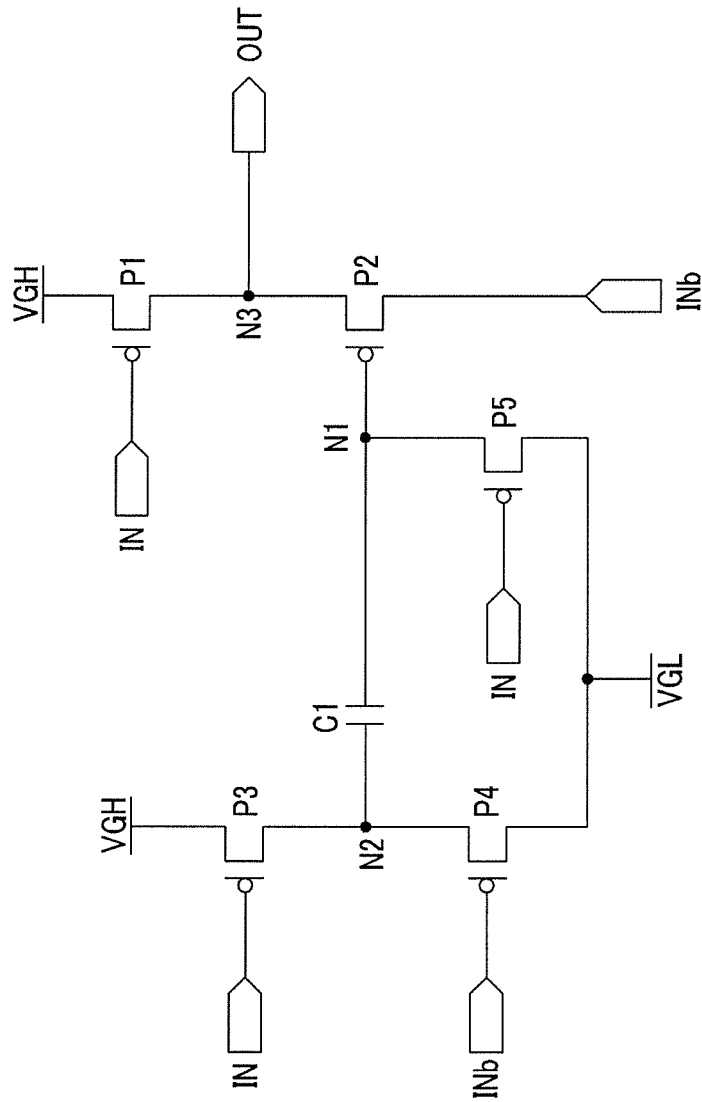
FIG. 1 is a circuit diagram of a buffer according to an exemplary embodiment of the present invention.

Hereinafter, some exemplary embodiments of the present invention will be described with reference to the accompanying drawings in order for those skilled in the art to be able to readily implement them. As those skilled in the art would realize, the described embodiments may be modified in various different ways, all without departing from the spirit or scope of the present invention.

Further, in the exemplary embodiments, constituent elements having the same construction are assigned the same reference numerals and are representatively described in connection with a first exemplary embodiment. In the remaining embodiments, only constituent elements that are different from those of the first exemplary embodiment are described.

Wherever possible, the same reference numbers will be used throughout the drawings to refer to the same or like parts.

Throughout this specification and the claims that follow, when it is described that an element is "connected," or "coupled," to another element, the element may be "directly coupled" to the other element or "electrically coupled" to the other element through one or more other elements. In addition, unless explicitly described to the contrary, the word "comprise" and variations such as "comprises" or "comprising" will be understood to imply the inclusion of stated elements but not the exclusion of any other elements.

When designing the driving circuit by using thin film transistors of the CMOS type, it is desirable to reduce or prevent deterioration due to the N-type element, and an LDD process is typically added for this. As a result, additional processes are used to obtain stability of the driving circuit, and the LDD process may deteriorate the process yield such that it is desirable for the circuit to be designed without N-type thin film transistors.

When the circuit is designed with P-type thin film transistors, research on stable circuit design for low power driving is required to realize an output signal of a low voltage level.

FIG. 1 is a circuit diagram of a buffer according to an exemplary embodiment of the present invention.

Referring to FIG. 1, a buffer according to an exemplary embodiment of the present invention includes a first transistor P1, a second transistor P2, a third transistor P3, a fourth transistor P4, and a fifth transistor P5.

An output voltage OUT may be output through an output terminal N3 at a junction where the first transistor P1 and the second transistor P2 are coupled.

The second transistor P2 and the fifth transistor P5 may be coupled to a first node N1, and the third transistor P3 and the fourth transistor P4 may be coupled to a second node N2.

The buffer according to an exemplary embodiment of the present invention also includes a capacitor C1, and the capacitor C1 may include one terminal (e.g., first terminal) coupled to the first node N1 and the other terminal (e.g., second terminal) coupled to the second node N2.

A first power source voltage VGH may be coupled to the first transistor P1 and the third transistor P3, and a second power source voltage VGL that is lower than the first power source voltage VGH is coupled to a junction at which the fourth transistor P4 and the fifth transistor P5 are coupled to each other.

The voltage values of the first power source voltage VGH and the second power source voltage VGL are not limited, however, the first power source voltage VGH is applied as a high level voltage (e.g., a predetermined high level voltage), and the second power source voltage VGL is applied as a low level voltage (e.g., a predetermined low level voltage).

The first transistor P1, the second transistor P2, the third transistor P3, the fourth transistor P4, and the fifth transistor P5 may be the same conductive type of transistor. For example, they may be PMOS transistors.

For example, the first transistor P1 includes a gate electrode supplied with an input signal transmitting an input voltage IN, a source electrode coupled to the first power source voltage VGH, and a drain electrode coupled to the output terminal N3.

When the gate electrode of the first transistor P1 is applied with a voltage having a gate-on voltage level, the first transistor P1 is turned on such that the voltage value of the first power source voltage VGH coupled to the source electrode is transmitted to the output terminal N3.

The second transistor P2 includes a gate electrode coupled to the first node N1, a source electrode supplied with an input inverted signal transmitting an inverted voltage INb having a voltage level of the input voltage IN that is inverted, and a drain electrode coupled to the output terminal N3.

The gate electrode of the second transistor P2 is coupled to the first node N1 such that a switching operation is controlled according to a voltage change of the first node N1.

That is, the voltage value of the first node N1 is changed to the gate-on voltage level of the second transistor P2, and the second transistor P2 is turned on such that the inverted voltage INb according to the input inverted signal coupled to the source electrode is transmitted.

The third transistor P3 includes a gate electrode supplied with the input signal transmitting the input voltage IN, a source electrode coupled to the first power source voltage VGH, and a drain electrode coupled to the second node N2.

When the input voltage IN of the input signal supplied to the gate electrode of the third transistor P3 is the voltage of the gate-on voltage level, the third transistor P3 is turned on such that the voltage value of the first power source voltage VGH coupled to the source electrode is transmitted to the second node N2.

The fourth transistor P4 includes a gate electrode applied with the inverted voltage INb having a voltage level of the input voltage IN that is inverted, a source electrode coupled to the second power source voltage VGL, and a drain electrode coupled to the second node N2.

When the inverted voltage INb of the input inverted signal supplied to the gate electrode of the fourth transistor P4 is the voltage of the gate-on voltage level, the fourth transistor P4 is turned on such that the voltage value of the second power source voltage VGL coupled to the source electrode is transmitted to the second node N2.

The fifth transistor P5 includes a gate electrode supplied with the input signal transmitting the input voltage IN, a source electrode coupled to the second power source voltage VGL, and a drain electrode coupled to the first node N1.

When the input voltage IN of the input signal supplied to the gate electrode of the fifth transistor P5 is the voltage of the gate-on voltage level, the fifth transistor P5 is turned on such that the voltage value of the second power source voltage VGL coupled to the source electrode is transmitted to the first node N1.

The capacitor C1 is coupled between the first node N1 and the second node N2, a voltage change of the second node N2 is reflected on the first node N1 by a coupling effect of the capacitor C1, and the switching state of the second transistor P2 is controlled according to the voltage of the first node N1.

In an exemplary embodiment of the present invention, the voltage of the first node N1 applied to the gate electrode of the second transistor P2 is a voltage that causes the second transistor P2 to be in the turned-on state.

Thus, an output signal output from the output terminal N3 has a voltage value according to the first power source voltage VGH transmitted according to the existence of the inverted voltage INb and the turn-on voltage of the first transistor P1. For example, the voltage of the output terminal N3 is the same level as the inverted voltage INb when only the second transistor P2 is turned on, and when the first transistor P1 is also turned on, the voltage of the output terminal N3 is determined according to the resistance ratio of the first transistor P1 and the second transistor P2.

Next, a generation process of the output signal according to the input signal of the buffer according to an exemplary embodiment of the present invention will be described in further detail by using a simulation graph of FIG. 3.

Figure 2:
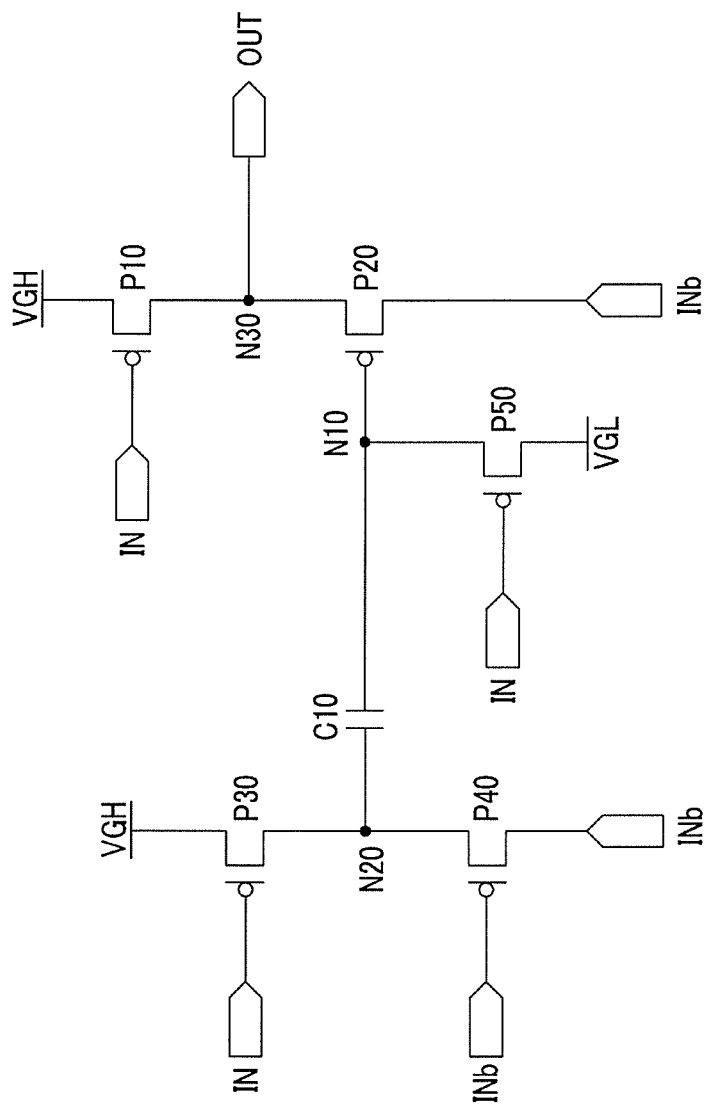
FIG. 2 is a circuit diagram of a buffer according to another exemplary embodiment of the present invention.
Figure 3:
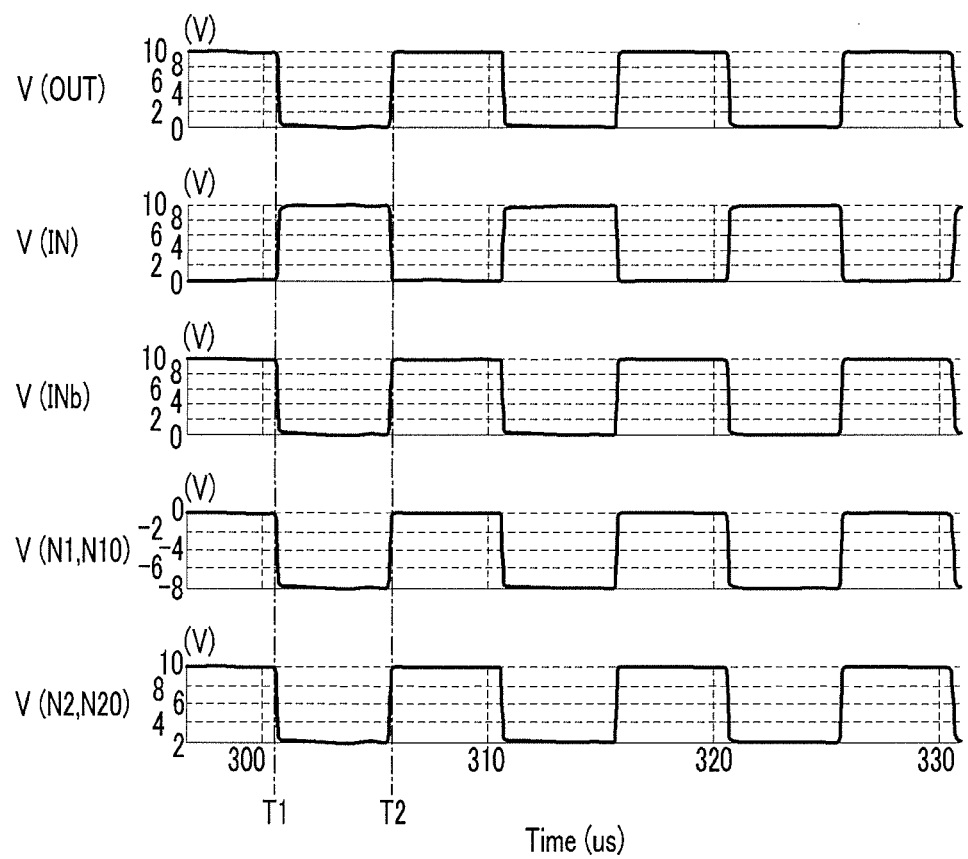
FIG. 3 is a graph showing a time-voltage characteristic obtained through a simulation for the buffer of the embodiments shown in FIG. 1 or FIG. 2.

FIG. 3 is a graph showing a time-voltage characteristic obtained through a simulation for the buffer of the embodiments shown in FIG. 1 or FIG. 2. A simulation for a buffer according to another exemplary embodiment shown in FIG. 2 that will be described after has the same result, such that the operation principle of the buffer having the circuit structure of the embodiment shown in FIG. 2 is omitted.

A voltage range (e.g., a predetermined voltage range) and a time of a time-voltage characteristic graph for the result of the simulation shown in FIG. 3 is one example, and the voltage range and the time are not limited thereto.

Also, a cycle of the input signal or the output signal shown in FIG. 3 is not limited thereto.

A range of the input voltage V(IN) applied according to the input signal is 0V-10V in the exemplary embodiment of FIG. 3. Accordingly, the inverted voltage V(INb) applied according to the input inverted signal of which the input signal is inverted is 10V-0V. For example, an input voltage IN of 10V would result in an inverted voltage V(INb) of 0V, while an input voltage IN of 0V would result in an inverted voltage V(INb) of 10V.

Here, the first power source voltage VGH is 10V, and the second power source voltage VGL is 0V, although the invention is not limited thereto.

Firstly, in FIG. 3, the level of the input voltage V(IN) of the input signal is a low level of 0V to a time T1.

All transistors in the buffer circuit of FIG. 1 are PMOS transistors such that the first transistor P1, the third transistor P3, and the fifth transistor P5 are turned on at this time in the circuit structure of FIG. 1.

Also, when the level of the input voltage V(IN) of the input signal is the low level, the level of the inverted voltage V(INb) of the input inverted signal is a high level of 10V. Accordingly, the fourth transistor P4 having the gate electrode that is applied with the voltage of the high level is turned off.

Thus, the first power source voltage VGH is applied to the second node N2 through the source electrode of the third transistor P3 such that a voltage value V(N2) of the second node N2 is 10V.

On the other hand, the voltage of the first node N1 is transmitted with the second power source voltage VGL through the source electrode of the fifth transistor P5, which is turned on such that a voltage value V(N1) thereof is the voltage value of the threshold voltage of the fifth transistor P5 reflected on the voltage value of the second power source voltage VGL. For example, the voltage of the first node N1 becomes "0V+|Vth,P5|".

Accordingly, the voltage of "0V+|Vth,P5|" as the low level voltage is applied to the gate electrode of the second transistor P2 such that the second transistor P2 is turned on.

In the case of the second transistor P2, the input inverted signal is supplied to the source electrode such that the voltage value of the inverted voltage V(INb) of 10V may be output to the output terminal N3 through the second transistor P2.

In an exemplary embodiment of the present invention, the first transistor P1 is also turned on such that the output terminal N3 receives the first power source voltage VGH, and the first power source voltage VGH is 10V, and as a result, the output voltage V(OUT) output to the output terminal N3 becomes 10V.

The voltage range of the input signal input to the buffer of embodiments according to the present invention, the first power source voltage VGH, or the second power source voltage VGL may be determined differently from the above-described example, and the output signal having the output voltage V(OUT) corresponding thereto may be output.

That is, in another exemplary embodiment of the present invention, when the first transistor P1 and the second transistor P2 are both turned on, the voltage applied to the output terminal N3 may be determined according to the resistance ratio of the first transistor P1 and the second transistor P2 between the first power source voltage VGH and the inverted voltage V(INb).

The level of the input voltage V(IN) of the input signal is increased and becomes the high level of 10V at the time T1 of FIG. 3.

Thus, in the circuit structure of FIG. 1, the first transistor P1, the third transistor P3, and the fifth transistor P5 are turned off.

Meanwhile, the level of the input voltage V(IN) of the input signal is the high level and the level of the inverted voltage V(INb) of the input inverted signal is the low level of 0V such that the fourth transistor P4 having the gate electrode applied with the voltage of the low level is turned on.

Accordingly, the voltage V(N1) of the first node N1 is floated as the voltage value of "0V+|Vth,P5|," which was previously applied.

The voltage V(N2) of the second node N2 is applied with the second power source voltage VGL of the low level through the source electrode of the fourth transistor P4 such that it is reduced (e.g., the voltage is discharged) from the 10V that was previously applied.

For example, the voltage V(N2) of the second node N2 is decreased (e.g., discharged) to the voltage value of "0V+|Vth,P4|" of which the threshold voltage (|Vth,P4|) of the fourth transistor P4 is reflected on the voltage value of the second power source voltage VGL.

Accordingly, the voltage value V(N2) of the second node N2 coupled to one terminal of the capacitor C1 is decreased (e.g., discharged) to "10V−(0V+|Vth,P4|)", that is, "10V−|Vth,P4|", such that the voltage value V(N1) of the first node N1 coupled to the other terminal of the capacitor C1 is decreased (e.g., ideally decreased or substantially decreased) to "10V−|Vth,P4|" by the coupling effect. That is, the voltage value V(N1) of the first node N1 becomes "|Vth,P5|+|Vth,P4|−10V". As a result, in the buffer according to an exemplary embodiment of the present invention, the voltage value V(N1) of the first node N1 applied to the gate electrode of the second transistor P2 is sufficiently low such that it completely enters the turned-on state even when the input voltage V(IN) of the input signal is at the high level.

That is, in the graph of FIG. 3, it may be confirmed that the voltage value V(N1) of the first node N1 is decreased by more than −8V such that the gate-on voltage level may be transmitted to the second transistor P2 without the influence of the variation of the threshold voltage (|Vth,P4|) of the fourth transistor P4 and the threshold voltage (|Vth,P5|) of the fifth transistor P5.

Thus, the voltage value of 0V of the inverted voltage V(INb) supplied to the source electrode of the second transistor P2 is output to the output terminal N3 through the second transistor P2 such that the output voltage V(OUT) becomes 0V.

In the graph of FIG. 3, when the voltage level of the input voltage V(IN) is again decreased at the time T2 and is applied as the low level, the above processes are repeated.

Accordingly, in FIG. 3, the input voltage V(IN) of the input signal periodically repeats the low level and the high level, thereby repeating the above operations such that the output voltage V(OUT), of which the input voltage V(IN) of the input signal is inverted, is output.

Accordingly, as shown in FIG. 3, it may be confirmed that the buffer according to an exemplary embodiment of the present invention is normally operated.

FIG. 2 is a circuit diagram of a buffer according to another exemplary embodiment of the present invention.

A buffer according to the exemplary embodiment shown in FIG. 2 includes a first transistor P10, a second transistor P20, a third transistor P30, a fourth transistor P40, and a fifth transistor P50, and further includes a capacitor C10 having one terminal (e.g., first terminal) coupled to a first node N10 and another terminal (e.g., second terminal) coupled to a second node N20.

The detailed connection structure of the transistors is the same as that of the buffer of the exemplary embodiment shown in FIG. 1 such that the description thereof is omitted. However, the voltage applied through a source electrode of the fourth transistor P40 and the fifth transistor P50 among the circuit structure of the buffer according to the exemplary embodiment shown in FIG. 2 is different from the exemplary embodiment shown in FIG. 1. That is, the source electrode of the fourth transistor P40 is not commonly coupled to the second power source voltage VGL along with the source electrode of the fifth transistor P50, which is different from the buffer of the embodiment shown FIG. 1.

The source electrode of the fourth transistor P40 is applied with the inverted voltage INb according to the input inverted signal, and the source electrode of the fifth transistor P50 receives the voltage value of the second power source voltage VGL.

In the driving of the buffer circuit according to the exemplary embodiment shown in FIG. 2, when the level of the input voltage IN of the input signal is increased such that it is applied as the high level, the fourth transistor P40 supplying the input inverted signal is turned on. Thus, the voltage value transmitted to the second node N20 corresponds to the inverted voltage INb according to the input inverted signal coupled to the source electrode of the fourth transistor P40. That is, the voltage value transmitted to the second node N20 is "0V+|Vth,P40|." In this voltage value, the threshold voltage (|Vth,P40|) of the fourth transistor P40 is reflected on the inverted voltage INb, which is the input voltage IN of the input signal inverted, when the level of the input voltage IN of the input signal is 10V. Accordingly, the driving principle of the buffer circuit according to the exemplary embodiment shown in FIG. 1 is substantially the same as that of the present exemplary embodiment. However, the inverted voltage INb according to the input inverted signal may be changed according to the input voltage IN of the input signal, which is different from the second power source voltage VGL that is fixedly supplied, according to one embodiment.

The circuit structure of the buffer according to an exemplary embodiment of the present invention may reduce the influence due to the process variation of the transistor compared with the circuit structure of a buffer using bootstrapping by a clock feed-through and using conventional PMOS transistors. The buffer circuit structure according to exemplary embodiments of the present invention uses the capacitors C1 and C10, thereby reducing or minimizing the distribution of the coupling effect for the process variation. Also, the efficiency circuit structure of which the area of the transistor is not increased and of which a buffer and an external supply power are not added is provided, and the second transistors P2 and P20 as the pull switch of the buffer may be completely turned on such that the operation of obtaining the output voltage is relatively easy. This circuit structure may obtain the output voltage without the large influence of the threshold voltage of the PMOS transistors such that drawbacks of the PMOS circuit, such as the realization of the output signal of the low level, may be solved.

While this invention has been described in connection with what is presently considered to be exemplary embodiments, it is to be understood that the invention is not limited to the disclosed embodiments. A person having ordinary skill in the art can change or modify the described embodiments without departing from the scope of the present invention, and it will be understood that the present invention should be construed to cover the modifications or variations. Further, the material of each of the constituent elements described in the specification can be readily selected from among various known materials and replaced thereby by a person having ordinary skill in the art. Further, a person having ordinary skill in the art can omit some of the constituent elements described in the specification without deteriorating performance, or can add constituent elements in order to improve performance. In addition, a person having ordinary skill in the art may change the sequence of the steps described in the specification according to process environments or equipment. Accordingly, the scope of the present invention should be determined not by the above-described exemplary embodiments, but by the appended claims and their equivalents.

What is claimed is:

1. A buffer comprising:
a first transistor for transmitting a first power source voltage to an output terminal according to an input voltage applied to a gate of the first transistor;
a second transistor for transmitting an inverted voltage of the input voltage to the output terminal;
a capacitor comprising a first terminal coupled to a gate of the second transistor and a second terminal configured to be input with a first level voltage or a second level voltage according to the input voltage;
a third transistor for transmitting a second power source voltage to the gate of the second transistor according to the input voltage applied to a gate of the third transistor, the input voltage also being applied to the gate of the first transistor;
a fourth transistor for transmitting the first level voltage to the second terminal of the capacitor according to the input voltage; and
a fifth transistor for transmitting the second level voltage to the second terminal of the capacitor according to the inverted voltage.

2. The buffer of claim 1, wherein the first transistor comprises:
the gate for receiving the input voltage;
a source for receiving the first power source voltage; and
a drain coupled to the output terminal.

3. The buffer of claim 1, wherein the second transistor comprises:
the gate coupled to the first terminal of the capacitor;
a source for receiving the inverted voltage; and
a drain coupled to the output terminal.

4. The buffer of claim 1, wherein the third transistor comprises:
the gate for receiving the input voltage;
a source for receiving the second power source voltage; and
a drain coupled to the first terminal of the capacitor.

5. The buffer of claim 1, wherein the second power source voltage is lower than the first power source voltage.

6. The buffer of claim 1, wherein the first level voltage is the first power source voltage.

7. The buffer of claim 1, wherein the fourth transistor comprises:
a gate for receiving the input voltage;
a source for receiving the first level voltage; and
a drain coupled to the second terminal of the capacitor.

8. The buffer of claim 1, wherein the second level voltage is the second power source voltage or the inverted voltage.

9. The buffer of claim 1, wherein the fifth transistor comprises:
a gate for receiving the inverted voltage;
a source for receiving the second level voltage; and
a drain coupled to the second terminal of the capacitor.

10. The buffer of claim 1, wherein a voltage applied to the first terminal of the capacitor is maintained within a voltage range for turning on the second transistor.

11. The buffer of claim 10, wherein the voltage range for turning on the second transistor is according to a voltage of the first terminal of the capacitor reflecting a voltage change of the second terminal of the capacitor by a coupling effect of the terminals of the capacitor.

12. The buffer of claim 10, wherein the voltage range for turning on the second transistor is between the second power source voltage transmitted when the third transistor is turned on and a voltage of the first terminal of the capacitor reflecting a voltage change of the second terminal of the capacitor by a coupling effect of the terminals of the capacitor when the third transistor is turned off.

13. The buffer of claim 12, wherein the second power source voltage is a voltage reflecting a threshold voltage of the third transistor, and
wherein the voltage of the first terminal of the capacitor reflecting the voltage change of the second terminal of the capacitor is a voltage reflecting a threshold voltage of the fourth transistor coupled between the second terminal of the capacitor and the second power source voltage.

14. The buffer of claim 1, wherein an output voltage output from the output terminal during a first period in which the first and second transistors are turned on is according to a resistance ratio of the first and second transistors.

15. The buffer of claim 14, wherein the output voltage output from the output terminal during a second period excluding the first period is the inverted voltage transmitted through the second transistor.

16. The buffer of claim 1, wherein the transistors of the buffer are thin film transistors of a same conductive type.

17. The buffer of claim 16, wherein the thin film transistors of the same conductive type are PMOS transistors.

18. A driving method of a buffer comprising a first transistor executing a first switching operation according to an input voltage, a second transistor executing a second switching operation according to the input voltage, a capacitor comprising a first terminal coupled to a gate of the second transistor, a third transistor comprising a source or drain electrode coupled to the gate of the second transistor and executing a third switching operation according to the input voltage, and an output terminal coupled to the first and second transistors, the method comprising:

during a period in which the input voltage is a first level voltage:
 applying a second level voltage according to the input voltage to a second terminal of the capacitor; and
 turning the first transistor and the second transistor on; and at a time when the input voltage is changed from the first level voltage to a third level voltage:
 changing a voltage of the second terminal of the capacitor to a fourth level voltage according to the input voltage;
 changing a voltage of the first terminal of the capacitor to a voltage according to a difference between the second level voltage and the fourth level voltage; and
 turning the first transistor off and turning the second transistor on.

19. The method of claim 18, wherein the turning the first transistor and the second transistor on comprises:
 turning on the third transistor to be in an on state by the first level voltage of the input voltage; and
 transmitting the fourth level voltage to the gate of the second transistor through the third transistor.

20. The method of claim 18, wherein the turning the first transistor off and turning the second transistor on comprises:
 turning off the third transistor; and
 floating the first terminal of the capacitor at the time when the input voltage is changed from the first level voltage to the third level voltage.

21. The method of claim 18, further comprising turning the first transistor and the third transistor off and turning the second transistor on during a period in which the input voltage is the third level voltage.

22. The method of claim 18, wherein the buffer further comprises a fourth transistor transmitting the second level voltage to the second terminal of the capacitor according to the input voltage, and wherein the second level voltage is a first power source voltage.

23. The method of claim 18, wherein the buffer further comprises a fifth transistor transmitting the fourth level voltage to the second terminal of the capacitor according to an inverted voltage of which the input voltage is inverted, and wherein the fourth level voltage is a second power source voltage or the inverted voltage.

24. The method of claim 18, wherein an output voltage output from the output terminal is according to a resistance ratio of the first transistor and the second transistor in an on state during the period in which the input voltage is the first level voltage.

25. The method of claim 24, wherein the output voltage output from the output terminal is an inverted voltage transmitted through the second transistor during a period excluding the period in which the input voltage is the first level voltage.

26. The method of claim 18, wherein a plurality of the transistors of the buffer are thin film transistors having a same conductive type.

27. The method of claim 26, wherein the thin film transistors having the same conductive type are PMOS transistors.

* * * * *